(12) United States Patent
Herz et al.

(10) Patent No.: US 7,287,110 B2
(45) Date of Patent: Oct. 23, 2007

(54) STORAGE DEVICE FOR A MULTIBUS ARCHITECTURE

(75) Inventors: Ralf Herz, Freiburg (DE); Carsten Noeske, Glottertal (DE)

(73) Assignee: Micronas GmbH, Freiburg (DE)

( * ) Notice: Subject to any disclaimer, the term of this patent is extended or adjusted under 35 U.S.C. 154(b) by 202 days.

(21) Appl. No.: 10/763,048

(22) Filed: Jan. 22, 2004

(65) Prior Publication Data
US 2004/0268020 A1   Dec. 30, 2004

(30) Foreign Application Priority Data
Jan. 22, 2003   (DE)   ................ 103 02 287

(51) Int. Cl.
*G06F 12/00*   (2006.01)
(52) U.S. Cl. .............. 710/107; 710/240; 710/307; 710/309; 711/147; 711/149; 711/200
(58) Field of Classification Search .......... None
See application file for complete search history.

(56) References Cited

U.S. PATENT DOCUMENTS

| | | | |
|---|---|---|---|
| 4,458,313 A | 7/1984 | Suzuki et al. | 364/200 |
| 4,982,321 A | 1/1991 | Pantry et al. | 364/200 |
| 5,202,856 A | 4/1993 | Glider et al. | 365/230 |
| 5,208,781 A | 5/1993 | Matsushima | 365/230 |
| 5,408,627 A | 4/1995 | Stirk et al. | 395/425 |
| 5,875,470 A * | 2/1999 | Dreibelbis et al. | 711/147 |
| 5,958,074 A * | 9/1999 | Sugimoto | 714/49 |
| 6,038,630 A | 3/2000 | Foster et al. | 710/132 |
| 6,098,136 A | 8/2000 | Okazawa et al. | 710/128 |
| 6,122,699 A | 9/2000 | Omo et al. | 710/131 |
| 6,138,204 A * | 10/2000 | Amon et al. | 711/104 |
| 6,584,528 B1 * | 6/2003 | Kurafuji et al. | 710/240 |
| 6,789,150 B1 * | 9/2004 | Jain | 710/305 |
| 2004/0059879 A1 * | 3/2004 | Rogers | 711/154 |

* cited by examiner

*Primary Examiner*—Hyung Sough
*Assistant Examiner*—Kaushik Patel
(74) *Attorney, Agent, or Firm*—O'Shea, Getz & Kosakowski, P.C.

(57) ABSTRACT

A storage device for a multibus architecture includes at least one memory to store data, information, and/or addresses, along with a memory connection having a port to connect the memory to one of the buses of the multibus architecture. The memory connection, the port, and the bus have data lines to transmit data along with address lines to transmit addresses, and/or control information to control the memory and other devices connected to each specific bus within the multibus architecture. A switching device selectively connects the memory connection to one of the buses to enable a memory access to transmit data, addresses, and/or control information to or from the selected one of these buses.

17 Claims, 2 Drawing Sheets

STORAGE DEVICE FOR A MULTIBUS ARCHITECTURE

BACKGROUND OF THE INVENTION

The invention relates in general to a multiple bus architecture associated with a signal processor and in particular to a memory storage device for use with such a multibus architecture.

To achieve a relatively high throughput of data in signal processors, these processors often include multiple connected read/write buses through which a single data memory storage device may be accessed simultaneously. Control of memory addresses is typically implemented through read/write buses by alternately transmitting addresses and data, or by transmitting addresses through a separate address bus apart from a data bus.

Where these systems involve one or multiple data memories and multiple buses (i.e., a multibus architecture), the actual memory/bus connection is usually achieved in a manner which is relatively disadvantageous. Two approaches are commonly utilized to achieve relatively efficient memory access to store data in the memory or to read data from the memory. Either a multi-port memory is used which has multiple memory connections to access different buses, or the various buses are connected to mutually independent memory blocks.

The first approach has the disadvantage that a multi-port memory is more complex and expensive to implement than a single-port memory. The second approach has the disadvantage that separation of the memory blocks negatively affects program flexibility and execution speed. For example, the memory partitioning must be defined within the program code, a capability which is often not provided in high-level languages such as C.

What is needed is a memory storage device for a multibus architecture which enables more efficient memory access.

SUMMARY OF THE INVENTION

A storage device for a multibus architecture includes at least one memory to store data, information, and/or addresses, along with a memory connection having a port to connect the memory to one of the buses of the multibus architecture. The memory connection, the port, and the bus have data lines to transmit data along with address lines to transmit addresses, and/or control information to control the memory and other devices connected to each specific bus within the multibus architecture. A switching device selectively connects the memory connection to one of the buses to enable a memory access to transmit data, addresses, and/or control information to or from the selected one of these buses.

A storage system, specifically a storage system within a processor or separate from and connected to a processor, may have a plurality of the storage devices selectively connected to each one of the different buses. The storage device may have a memory-specific logic device and an interrupt line to transmit an interrupt signal to the processor. The processor may control operation of the storage system. Transmission of the interrupt signal may trigger an interruption of the operation of the processor for, for example, one clock cycle whenever a memory access by the memory to the memory or memories of two different buses within two successive clock cycles is to be effected.

The memory may have an address analyzer to analyze the addresses on the buses and/or the address lines assigned to the memory for memory accesses, and for switching the switching device to one of the corresponding buses. The analyzer analyzes address segments and switches and assigns memory access for address segments smaller than the word width of a bus or of address lines transmitting the addresses, such that the memory may be smaller than the actual required memory space. Additional data for storage may be stored in a different memory.

An adjustable separator device (e.g., a programmably-adjustable separator device), for storing the memory address or access address for the memory for analysis by the analyzer, allows the memory to assign any addresses, for example, to be able to overlay external memories.

The analyzer may have a common access control device to switch the switching device, and one comparator each per bus to compare the address with the memory address of the memory, thereby allowing the component-related expense to be reduced. The analyzer may include a modifier that processes different data and/or access types which are applied through data lines, subaddress lines, and/or access signal lines selected by the switching device to a data memory segment of the memory to transmit the states on the bus lines.

A logic device to output a block loss signal through a loss line to the processor serves to issue a signal in response to a deviation from announced and executed data transfers during the memory access.

A storage system may have a plurality of such memories which are connected to a multibus architecture having a plurality of buses. All or some of the memories may be connectable to some of the buses.

Specifically, during switching between read access and write access for one of the memories, different memories may be controlled alternately by the clock cycle in a common process.

The use of such memories is advantageous particularly in the form of memories for a processor.

An interrupt signal to suspend the processor clock of a higher-level processor or to select a different memory may be generated and issued whenever a memory access by the memory to two different buses, or by two different buses to the memory, is to be effected within two successive clock cycles to prevent loss of data. Having the processor use the logic device to generate a command such as a clock control signal to interrupt the processor clock or a memory select signal to select a different storage device, and send this signal to the processor, prevents loss of data or drop-out periods during switching operations between read states and write states.

For memory accesses, address lines on the buses assigned to the memory, or address lines for determining the switching position of the switching device, may be analyzed.

It is also possible to search address segments smaller than the word width of the address as the assigned memory address during the analysis and to use the segments as the switching criterion. This is advantageous for the distribution of data between multiple memories of this type. To this end, a method may be used in which the highest-value bit of the address to determine the access address is compared with an adjustable register, specifically a programmable register, and the memory access is enabled in the case of a match. This procedure may be employed, for example, to implement an overlay procedure in which another memory, for example a slower and larger memory is overlaid.

To control a switching device, selected data lines, subaddress lines, and/or access signal lines of a selected bus are used to generate switching signals or commands in the event data or information transmitted over the selected bus does not match (in terms of the amount of data) the amount of memory space available per memory access operation.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
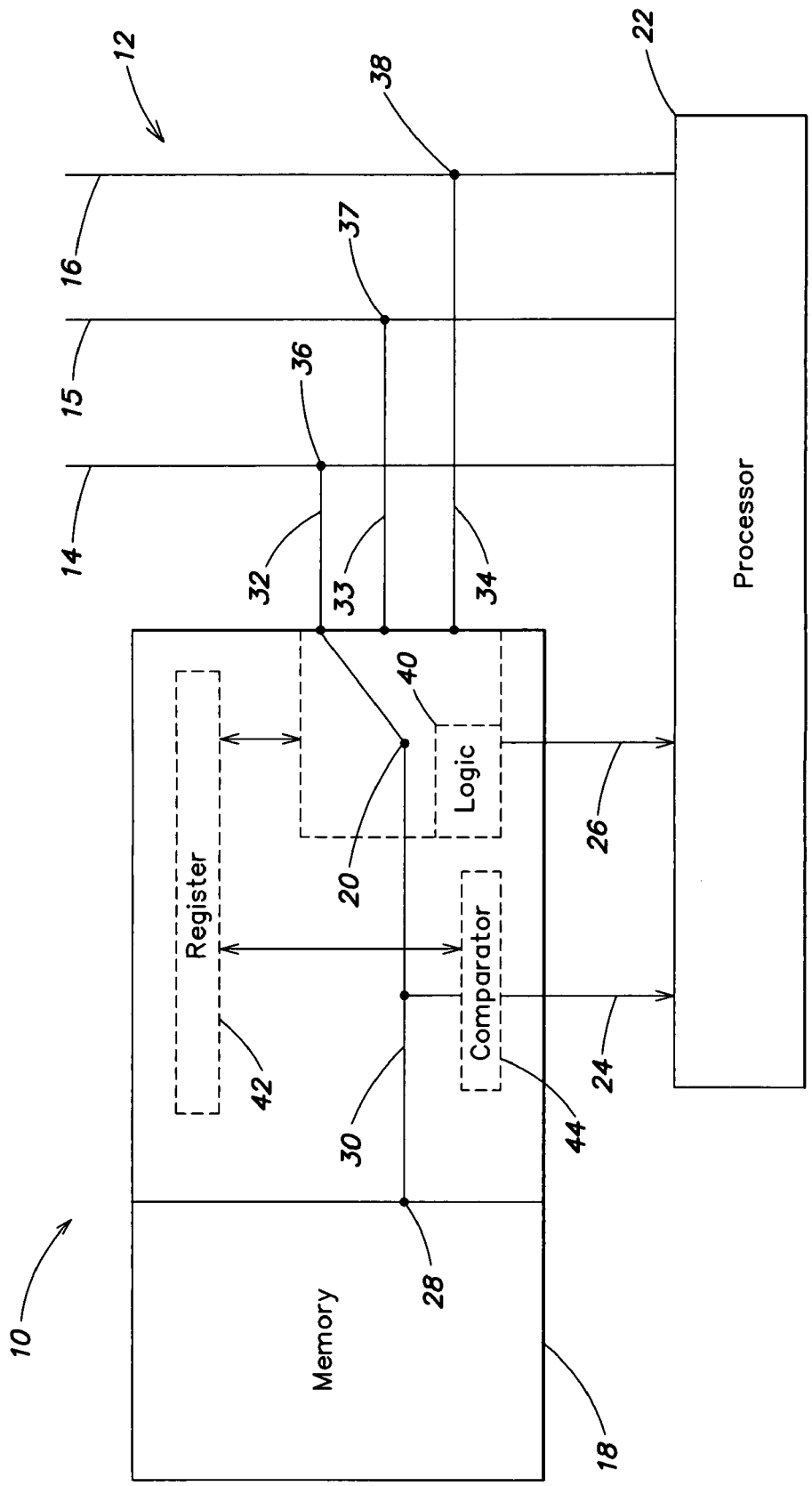
FIG. 1 is a schematic block diagram illustration of a storage device including a memory which may be connected to a multibus architecture using a switching device.

Referring to FIG. 1, a storage device 10 is connected to a multibus architecture 12, which may include three buses 14-16. The storage device 10 includes a memory 18 which may be selectively connected through a switching device 20 to one of the buses 14-16. Any additional components that might be required to operate the storage device 10, such as address buses and other control buses, may be added in accordance with the commonly available technical knowledge.

The memory 18 is connected through the multibus architecture 12 to a processor 22 according to the preferred embodiment. The processor 22 may have a storage system that includes a plurality of the memories 18, of which one bus 14-16 each is able to be controlled simultaneously for a memory access. As used herein, memory access means both the writing to the memory 18 of data (e.g., information data), and the reading of this data from a memory area of the memory 18 through one of buses 14-16. The buses 14-16 connect to the processor 22. Other control devices, interface components, and the like are not shown in FIG. 1 since these components may be implemented in a manner that should be apparent to one of the ordinary skill in art. A pair of control signals on lines 24, 26 transmit, for example, a block loss signal on the line 24, and an interrupt signal on the line 26. Other commands may be transmitted on these lines 24, 26 to the processor 22.

The memory area 18 of the storage device 10 has a memory connection 28 in the form of a memory port of the conventional type. The memory connection is connected to the switching device 20 through data lines 30 which may be part of a data bus. The switching device 20 selectively switches the data lines 30 through corresponding lines 32-34 and external ports 36-38 to one of the buses 14-16.

A logic device 40 switches the switching device 20, which is connected preferably to additional devices such as a memory separator register or memory tag register 42 and at least one comparator 44. The block loss signal on the line 24 starts, for example, from the comparator 44 and leads to the processor 22, while the interrupt signal line 26 leads from the logic device 40 to the processor 22.

In a preferred embodiment, a conventional common data memory may be subdivided into multiple blocks or storage devices functioning as the storage system of the processor, which blocks, for example comprising the memory 18, may have a single internal access connection 28. The multiple read/write buses 14-16 are connected to each of these memories 18 through the switching device 20. The logic device 40 integrated within the block or storage device 10 acts as an access control device and controls the memory access of the different buses 14-16 to the block 10 and to the memory 18 located in the block, or of the memory 18 to one of the buses 14-16. It is not necessary that each of the memories 18 be connectable to all of the buses 14-16.

Whenever two of the buses 14-16 are to simultaneously access the same memory 18, the logic device 40 sends the interrupt signal on the line 26 to the processor 22 or to a clock control device of the processor 22 to suspend the processor clock for one clock cycle. This allows the switching device 20 to switch successive accesses to the two requesting buses 14-16 and the corresponding states to be transmitted on the bus lines 14-16. Alternatively, appropriate programming and/or an appropriate wiring layout of the processor 22 may handle the suspension of the processor clock.

Specifically, write access is possible in smaller units than the word width of the buses 14-16 without losing a clock cycle; for example, byte-by-byte accessing for a 32-bit bus. The actual read-modify-write operation for this example requires the usual two clock cycles. To prevent the loss of a clock cycle, buffering is implemented by the logic device 40 on the incoming side of the memory 18 and by any other devices connected to the logic device 40. In the alternative, an appropriate access control signal on the line 26 may be exchanged with the processor 22 so that the memory 18 may not be acted upon during the next clock cycle and the processor 22 does not need to be suspended, but instead accesses a different memory 18 during this next clock cycle.

The memory-block-specific logic device 40 may be expanded by using the comparator 44 which compares the highest-value bit of the address with an adjustable register, for example, a register adjustable by programming, and operates in the event of a match. The result is that the individual memories 18 of a plurality of such memories 18 are able to be arranged in any manner within a linear address space. For example, a memory of a slow external memory module may be overlaid by a memory access to the memory 18, then copied back upon termination of a corresponding dedicated program segment. This method, known as the overlay procedure, enables fast access to the data despite the fact that the internal memory of the processor may be smaller than the memory required for the application. A relatively larger required memory area is thus appropriately managed by splitting among multiple smaller memories 18.

The memory 18 in FIG. 1 has only one data line or data bus 30. In principle, it is possible to transmit address data and information data in temporal sequence over a single bus, where the address data indicate to which, or from which, the memories 18 or addresses within the memory 18 the information data are to be transmitted as the actual data. Alternatively, it is possible to employ a separate address bus through which exclusively address data are transmitted, with the result that only actual useful data, and possibly additional address or control information, are transmitted through the data bus 30.

Figure 2:
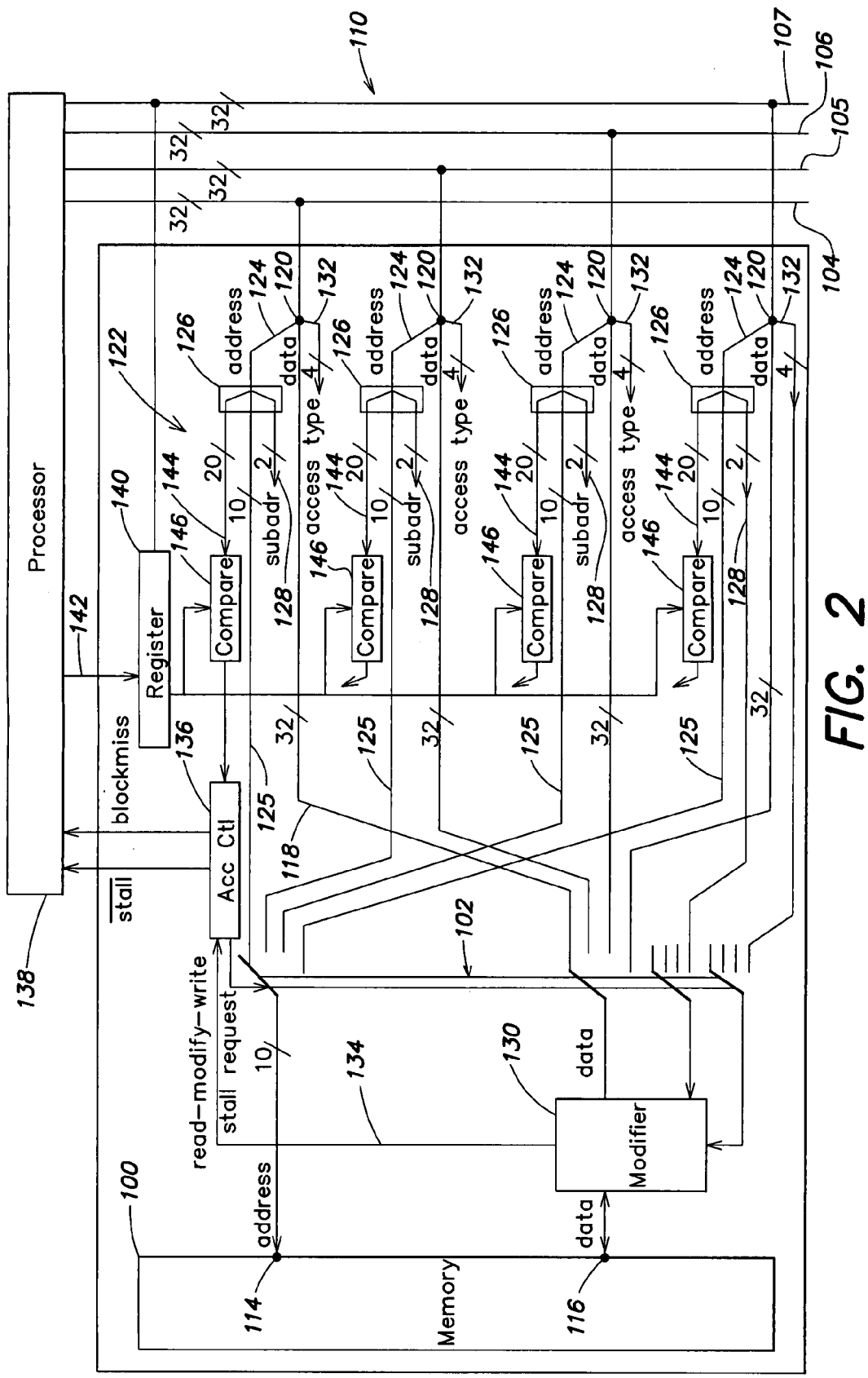
FIG. 2 is a schematic block diagram illustration of the storage device of FIG. 1 including individual components of a logic device to control the switching device.

Referring to FIG. 2, a memory 100 having a plurality of addressable memory locations is connectable through the switching device 102 to one of the multiple buses 104-107 of a multibus architecture 110. Connections to the memory 100 include an address memory connection 114 and a data memory connection 116. The addresses for addressing internal memory locations of the memory 100, which may be transmitted through a separate address bus or through one of the buses 104-107, are applied to the address memory connection 114. The address information is supplied from the actively switched bus 104. It is also possible to have addresses supplied through the bus 104 in the form of a programming bus such that the switching device 102 implements switching to the programming bus 104 routinely or upon completion of a memory access. To implement a data access, the switch-over to the required additional bus 105-107 is effected as required.

Starting from the buses 104-107 which may, for example, be 32-bit buses, a 32-bit line 118 leads to a data input switch of the switching device 102. Depending on the switching position of the switching device 102, a 32-bit data line or a 32-bit data bus 118 is thus routed from the selected bus 104-107 through the switching device 102 to the data memory connection 116. This is done to write or read the relevant data or line states to or from the memory area of the memory 100 being addressed.

The data line 118 which leads from each bus 104-107 to the corresponding switching connection of the switching device 102 has a splitter 120 at the input of a logic device 122 composed of a plurality of individual components. The splitter 120 may, for example, be in the form of a tap, where the individual data lines of the data bus 118 are tapped and routed as address lines 124 to a divider 126. In this example, the divider 126 separates out ten address lines 125 and routes these lines 125 to an appropriately connected address line input of the switching device 102. Depending on the switching position, the address signal of the selected bus 104-107 is thus applied to the address memory input of connection 114 of the memory 100.

In addition, two address lines 128 are separated out from each divider 126 to transmit subaddresses, then routed to an appropriately connected input of the switching device 102 which passes on the subaddress of the selected bus 104-107 to a modifier 130.

Each splitter 120 also splits the data lines 118 (e.g., four lines 132 with information about the access type) from the data lines 118 and routes these four lines 132 to an appropriately connected input of the switching device 102. The switching device 102 also applies the signals or states of access type lines 132 to the modifier 130 depending on the switching position of the selected bus 104-107.

The modifier 130 may also be interconnected between the switched data line 118 and the data memory connection. The modifier 130 serves to modify the received data from the selected bus 104-107 and determines, in terms of the access type (e.g., a write access or read access), whether what is found on the data line 118 is a complete word, shortened word, or one byte from an original data word which is to be transmitted during the memory access, or if it is a label or signal that has been extended in some way.

In addition, the modifier 130, among other functions, passes on a read-modifier-write signal on a line 134 to an access control device 136 forming an additional component of the logic device 122. In connection with a processor 138, the access control device 136 controls access to the memory 100. The access control device 136 additionally controls the operation of the switching device 102.

The memory logic 122, as the analyzer or part of the analyzer, may also have a memory separator register or memory tag register 140 which is programmable, for example through the bus 107, with the access address of the memory 100. The memory tag register 140 may also have an overflow signal on a line 142 provided to it by the processor 138 for memory overflow protection.

Twenty of the address lines 124 branch off from each divider 126. Each of these twenty address lines 144 are routed to a comparator 146. Each comparator 146 compares the received address data with the address data stored in the memory tag register 140 and provides the comparison result to the access control device 136 for further processing.

Although the present invention has been shown and described with respect to several preferred embodiments thereof, various changes, omissions and additions to the form and detail thereof, may be made therein, without departing from the spirit and scope of the invention.

What is claimed is:

1. A storage device for a multibus architecture, comprising:
   at least one memory that stores information;
   a memory connection having a port that is connected to the at least one memory and is selectively connected to one of a plurality of buses within the multibus architecture, at least one data line that communicates with the memory connection and the one of the plurality of buses to provide information to the memory connection to control the memory;
   a switching device that selectively connects the memory connection to one of the plurality of buses to transmit information between the one of the plurality of buses and the memory; and
   an analyzer that analyzes addresses on address lines which form a part of at least one of the plurality of buses for determining a selective access to the at least one memory by one of the plurality of buses, where the analyzer comprises an access control device that switches the switching device and a comparator that compares an address on one of the plurality of buses with a memory address of the at least one memory and controls the access control device to control the switching device as a function of the result of the comparison.

2. The storage device of claim 1, further comprising:
   a logic device connected with an interrupt line that transmits an interrupt signal on the interrupt line from the logic device to a processor, where the interrupt signal interrupts operation of the processor for one clock cycle whenever a memory access is to be effected by the memory to two of the plurality of buses within two successive clock cycles.

3. The storage device of claim 1, where the analyzer analyzes a part of the addresses and switches and assigns a memory access for address segments smaller than a word width of one of the plurality of buses having the addresses.

4. The storage device of claim 1, further comprising an adjustable separator device that stores a memory address of the at least one memory for analysis by the analyzer.

5. The storage device of claim 1, where the analyzer further comprises a modifier that processes different types of information applied to the modifier, where each one of the plurality of buses is selectively connected by the switching device to the modifier.

6. The storage device of claim 1, further comprising a logic device that provides a block loss signal on a signal line to a processor in response to a deviation from an executed data transfer during an access to the at least one memory.

7. The storage device of claim 1, where the at least one memory stores information that comprises data.

8. The storage device of claim 1, where the at least one memory stores information that comprises addresses.

9. A storage device for use with a bus architecture having a plurality of buses including address, data and control information transmitted on the plurality of buses, the storage device comprising:
   a memory;

a switching device that selectively connects the memory with one of the plurality of buses to transmit information on the selected one of the plurality of buses to the memory;

a logic device that provides an interrupt signal on a line to a processor to interrupt operation of the processor whenever an access to the memory is desired by at least one of the plurality of buses; and an analyzer that analyzes an address on address lines that form a portion of at least one of the plurality of buses, where the analyzer controls the switching device to selectively connect one of the plurality of buses to the memory depending on the address that is analyzed by the analyzer, where the analyzer further comprises an access control device that switches the switching device and at least one comparator that compares an address on one of the plurality of buses with a memory address of the memory and controls the access control device to control the switching device as a function of the result of the comparison.

10. The storage device of claim 9, further comprising a separator device that stores the address for analysis by the analyzer.

11. The storage device of claim 9, where the analyzer further comprises a modifier that determines the type of information that is provided to the memory for storage thereby.

12. The storage device of claim 11, where the modifier determines the type of information that is provided on the one of the plurality of buses that is connected with the memory by the switching device.

13. The storage device of claim 9, where the memory further comprises a memory connection that facilitates connection of the memory to the one of the plurality of buses selectively connected to the memory by the switching device.

14. The storage device of claim 9, where the information stored by the memory comprises data.

15. The storage device of claim 9, where the logic device provides a block loss signal on a line to the processor in response to a deviation from an executed data transfer during an access to the memory.

16. A method for storing data in a memory storage device for use with a bus architecture having a plurality of buses, the method comprising:

selectively connecting the memory storage device with one of the plurality of buses to transmit the information on the selected one of the plurality of buses to the memory storage device;

interrupting operation of a processor whenever an access to the memory storage device is desired by at least one of the plurality of buses; and analyzing an address on address lines that form a portion of at least one of the plurality of buses and by controlling the selective connection of one of the plurality of buses to the memory storage device depending on the address analyzed by the analyzer, where the step of analyzing further comprises the step of controlling access to the memory storage device by comparing an address on one of the plurality of buses with a memory address of the memory storage device and selectively connecting the memory storage device with one of the plurality of buses as a function of the comparison step.

17. A storage device for a multibus architecture, comprising a memory device to store data, addresses and control information;

a first bus, a second bus and a third bus each having data lines to transmit the data, addresses and control information between the first, second and third buses and the memory device via a memory connection to control the memory device;

a switching device that selectively connects the memory connection to a selected one of the first, second and third buses for memory access to effect transmission of the data, addresses or control information via the selected first, second or third bus;

an analyzer connected on the input side of the memory device for analyzing addresses on the address lines and switching the switching device to one of the first, second or third buses; and programmable separator device that stores a memory address of the memory device for analysis by the analyzer.

* * * * *